United States Patent [19]

Ide

[11] Patent Number: 5,358,017
[45] Date of Patent: Oct. 25, 1994

[54] METHOD, SYSTEM AND APPARATUS FOR FORMING LEADS FOR SEMICONDUCTORS PACKAGES

[75] Inventor: Shuji Ide, Reno, Nev.

[73] Assignee: Y.K.C. Co., Ltd., Tokyo, Japan

[21] Appl. No.: 54,438

[22] Filed: Apr. 20, 1993

[30] Foreign Application Priority Data

Aug. 25, 1992 [JP] Japan ................... 4-247211

[51] Int. Cl.⁵ ................................ B21F 45/00
[52] U.S. Cl. ................................ 140/105
[58] Field of Search ................... 140/105, 147

[56] References Cited

U.S. PATENT DOCUMENTS 3,267,716  8/1966  Hales ....................... 140/106
5,065,504  11/1991 Olla ......................... 140/105

FOREIGN PATENT DOCUMENTS 275525  11/1987  Japan ...................... 140/105
157717  6/1989   Japan ...................... 140/105

*Primary Examiner*—Lowell A. Larson
*Attorney, Agent, or Firm*—Eugene E. Renz, Jr.

[57] ABSTRACT

A forming apparatus for bending the leads of a semiconductor package including a body portion, and a plurality of leads extending from the sides of the body portion to a predetermined configuration. The forming die includes a series of walls arranged in a predetermined pattern having a seat for the body portion of the semiconductor package and a series of stepped outer wall portions. A plurality of a elongated spaced rigid portions on the outer surface of the wall portion define a series of grooves for receiving the leads of the semiconductor package. A punch adapted for reciprocating movement relative to the forming die engages and presses the leads into the grooves so that the leads conform to the outer wall portions of the die.

5 Claims, 7 Drawing Sheets

METHOD, SYSTEM AND APPARATUS FOR FORMING LEADS FOR SEMICONDUCTORS PACKAGES

FIELD OF THE INVENTION

The present invention relates to a method, system and apparatus for forming the external leads of a semiconductor package to a predetermined final configuration. More specifically the invention relates to an apparatus characterized by novel features of construction and arrangement producing a package wherein the pads, or free terminal ends of the leads, all lie in a common plane and are therefore "co-planar" and wherein the lead to lead spacing tolerance is in a predetermined, precise range.

BACKGROUND OF THE INVENTION

The device shown in FIG. 9 a semiconductor package generally of the type to which the present invention relates. The package comprises a generally rectangular body portion 12 and a plurality of leads 20 extending from the sides of the body portion and which are of a Z-shaped configuration, commonly referred to as "Z-shaped gull winged leads". These packages are presently manufactured by bending the leads to the Z-shaped configuration shown. The leads 20 must be within two working accuracies. One is the so-called "lead co-planarity" and the other is "lead skew". Lead co-planarity means the scattering of each lead 20 in the vertical direction, as represented by arrow A in FIG. 9, or said another way, the free terminal ends of the leads are defined as being co-planar when they all lie in a common plane P—P. Lead skew means the amount of distortion of the leads 20 in the transverse direction, as represented by arrow B in FIG. 9. Ideally, the spacing between adjacent leads for all of the leads 20 is within a predetermined, precise range.

Presently, the leads 20 are formed by clamping them between a forming die and a punch which is then reciprocated to bend the leads to the Z-shaped configuration. It has been found that this method requires a relatively high pressing force to secure lead co-planarity and that this high force adversely effects the lead skew, or lead to lead tolerance. Conversely, when the pressing force is decreased in an attempt to maintain the lead to lead tolerance and minimize lead skew, the lead co-planarity is adversely affected. Thus the conventional bending apparatus presently used for making semiconductor packages of this type is unsatisfactory since securing lead co-planarity is incompatible with minimizing lead skew.

SUMMARY OF THE INVENTION

With the foregoing in mind, it is an object of the present invention to provide an apparatus for forming the leads of Z-shaped gull winged configuration characterized by novel features of construction and arrangement wherein the lead co-planarity and the lead skew, or lead to lead spacing, are within predetermined controlled tolerances. To this end, the apparatus includes a forming die having a plurality of grooves for receiving the external leads of the semiconductor package. Accordingly, when the leads are pressed by a punch, the leads are engaged in the grooves so that even when the pressing force is increased for maintaining the accuracy of lead co-planarity, the leads are prevented from being transversely moved in the grooves and thus the lead to lead tolerances are maintained. Thus, by the apparatus and method of the present invention, it is possible to secure both lead co-planarity and lead spacing accuracy and minimize lead skew. The present invention eliminates the problems associated with the prior art relating to lead skew.

BRIEF DESCRIPTION OF THE DRAWINGS

These and other objects of the present invention and the various features and details of the operation and construction thereof are hereinafter more fully set forth with reference to the accompanying drawings, wherein.

DETAILED DESCRIPTION OF THE PREFERRED EMBODIMENT

Figure 9:
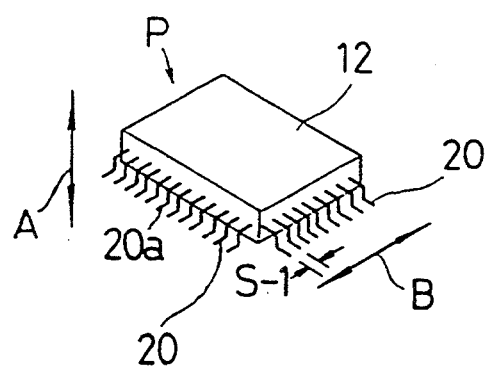
FIG. 9 is a perspective view of a semiconductor package made in accordance with the apparatus and method of the present invention.

The present invention relates to a method, system and apparatus for forming semiconductor packages P of the configuration shown in FIG. 9, commonly referred to as "gull winged" lead configuration packages. The semiconductor package P has a generally rectangular body portion 12 made of a ceramic material and a plurality of leads 20 projecting from the sides of the body portion 12 of generally Z-shaped configuration.

The apparatus for forming the leads 20 comprises a forming die 14 and a punch 16 adapted for reciprocating movement relative to the forming die 14 to form the leads 20 of the desired Z-shaped configuration. The apparatus is characterized by novel features of construction and arrangement whereby the leads 20 are formed in a manner insuring co-planarity of all of the leads, that is a semiconductor package P wherein all of the pads or feet 20$^a$ of the leads 20 lie in a common plane P—P and the lead to lead spacing S-1 is within prescribed, predetermined tolerances. To this end, the forming die 14, which is best shown in FIGS. 1-4, inclusive, includes four upstanding walls 18 arranged in a square which project upwardly from the lateral sides 14$^a$ of the die 14. The walls 18 have an internal angular shelf 19 defining a seat S-2 for the body portion 12 of the semiconductor package P wherein the leads which initially project laterally from the body portion 12 of the packages P in the manner shown in FIG. 4 engage the upper edge 18$^a$ of the walls 18 as shown. The outer surface of each wall 18 is of a stepped or undulating configuration comprising a first rounded or arcuate edge surface 22, a first slightly outwardly inclined surface 24 extending downwardly and outwardly from the edge 22 to a rounded juncture 26 connecting the first inclined surface 24 with a second inclined lateral surface 28, which in turn connects to a rounded edge 30 with a third downwardly inclined surface 32. As best shown in FIG. 4, the first inclined surface 24 extends at a relatively small angle 2° relative to the vertical axis A—A of die, the second inclined surface 28 extends at a much greater angle 83°, and the third lateral inclined surface 32 extends at an angle 46°.

Figure 1:
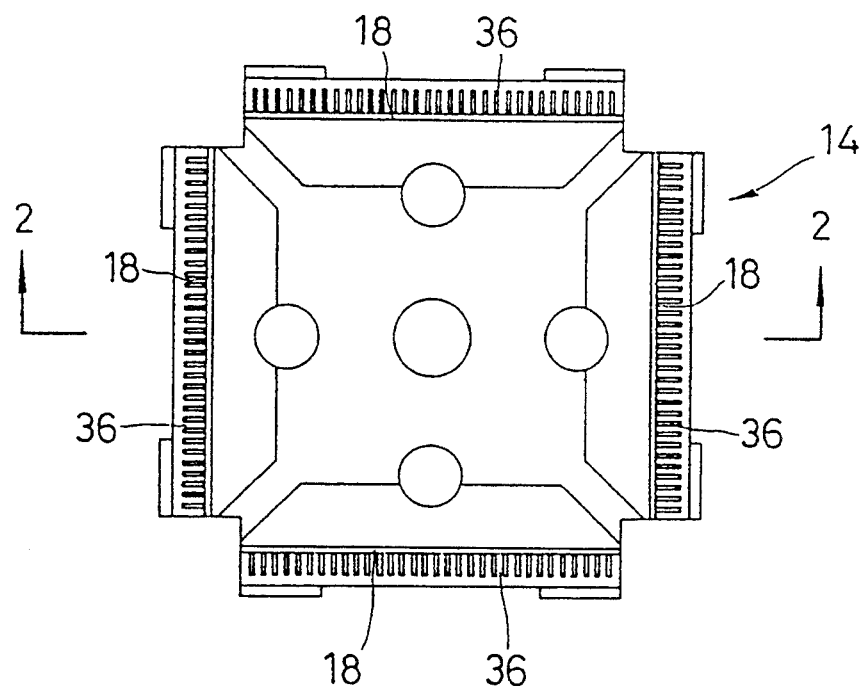
FIG. 1 is a plan view of a forming die in accordance with the present invention.
Figure 2:
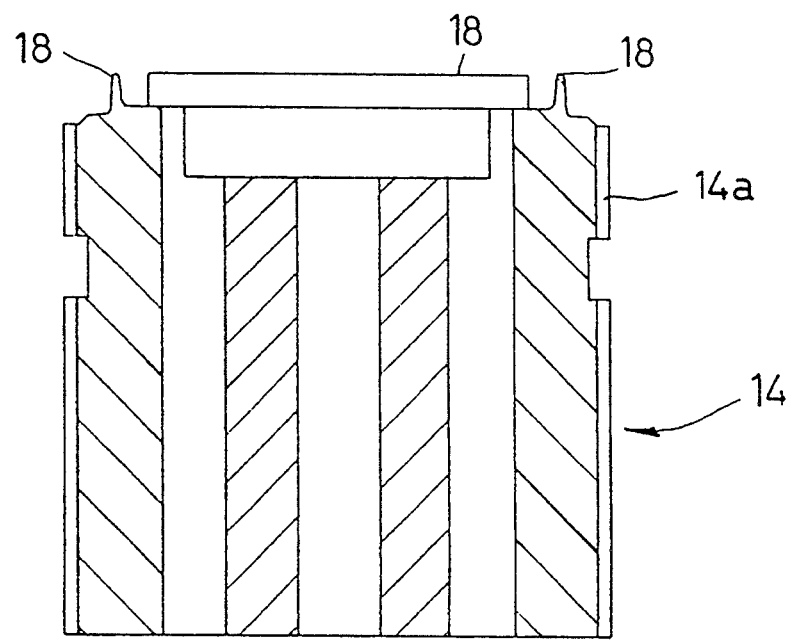
FIG. 2 is an enlarged transverse sectional view taken on lines 2—2 of FIG. 1.
Figure 3:
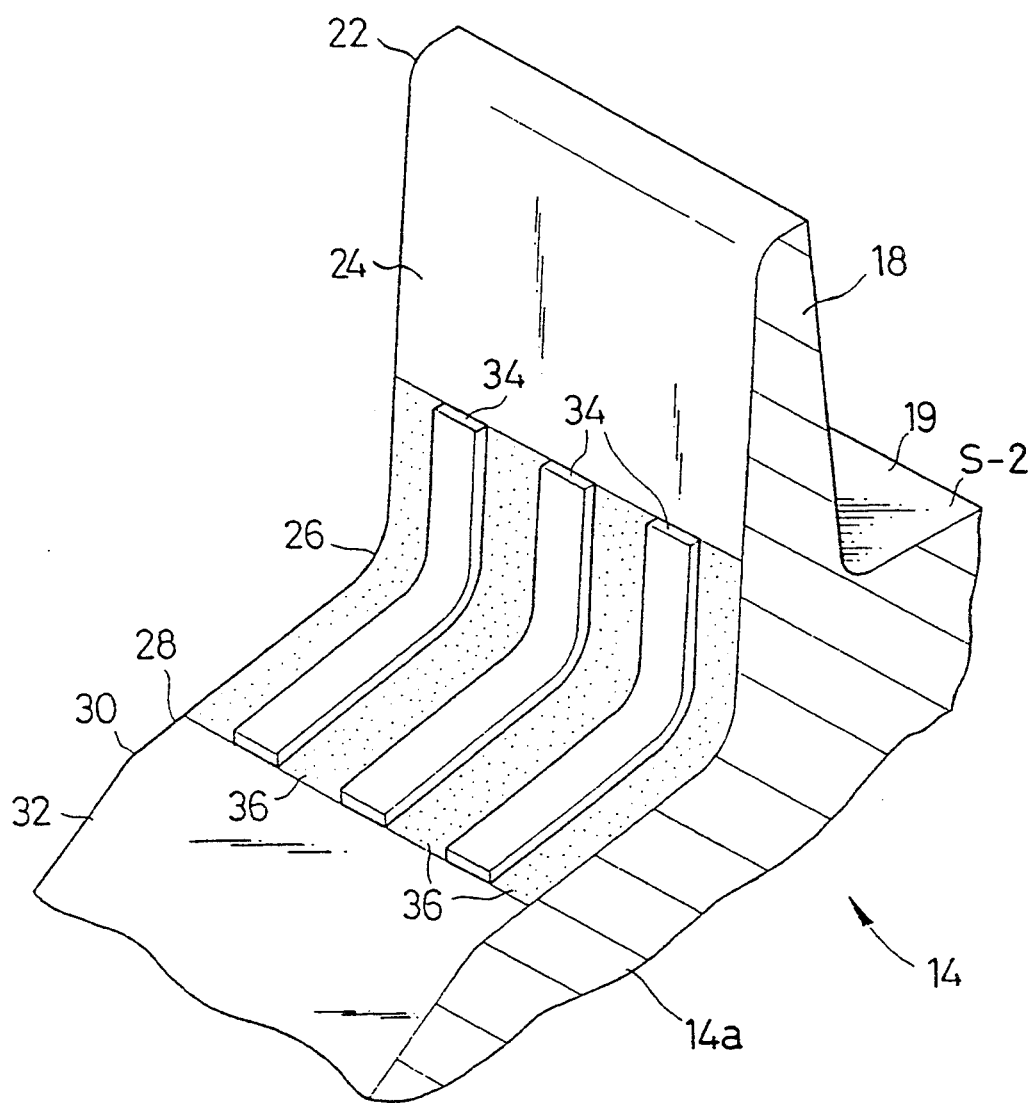
FIG. 3 is an enlarged perspective view of the forming die shown in FIG. 1.
Figure 4:
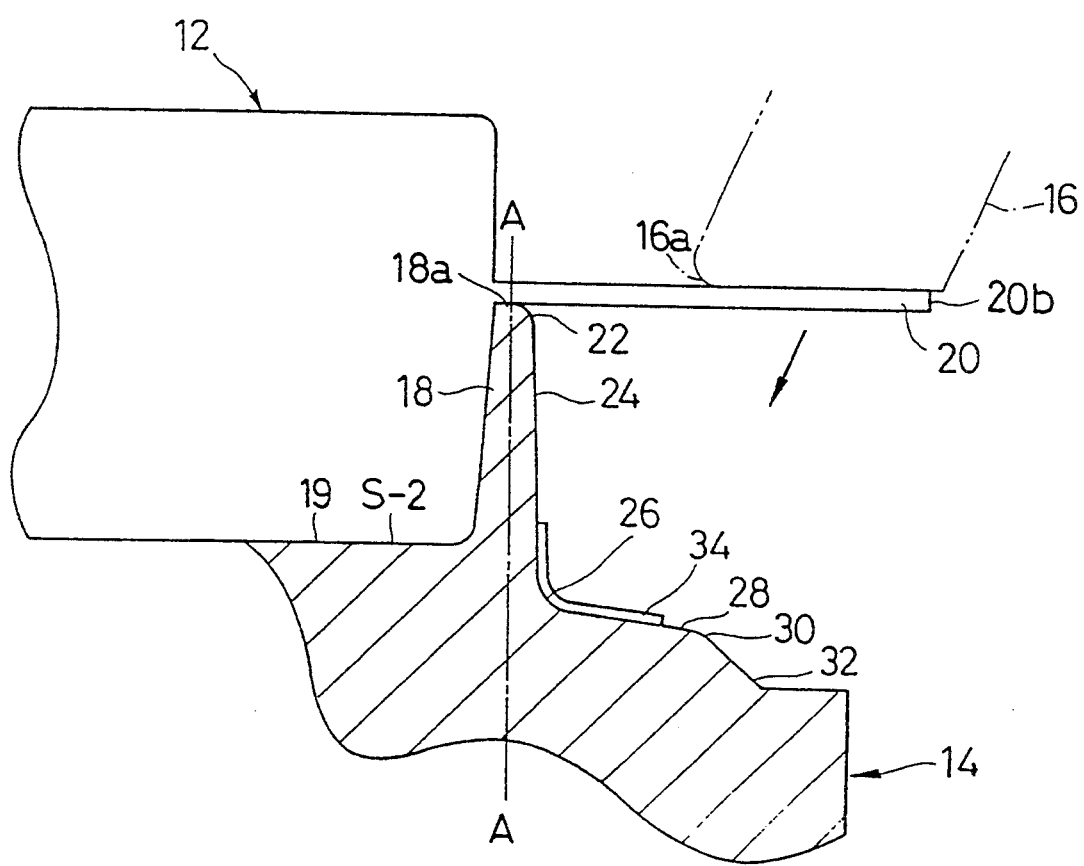
FIG. 4 is an enlarged transverse sectional view through the forming die shown in FIG. 1 showing a semiconductor package positioned in the die prior to formation of the leads.
Figure 5:
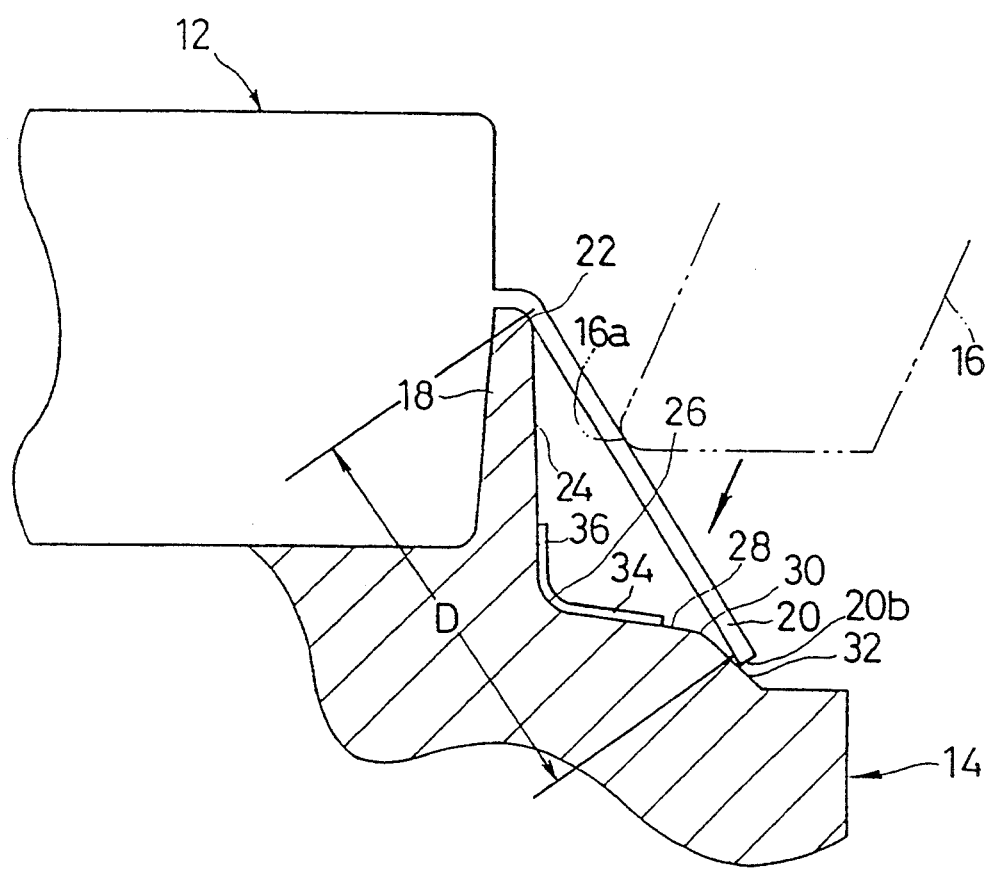
FIG. 5 is an enlarged transverse sectional view similar to FIG. 4 showing the process of bending the leads.
Figure 6:
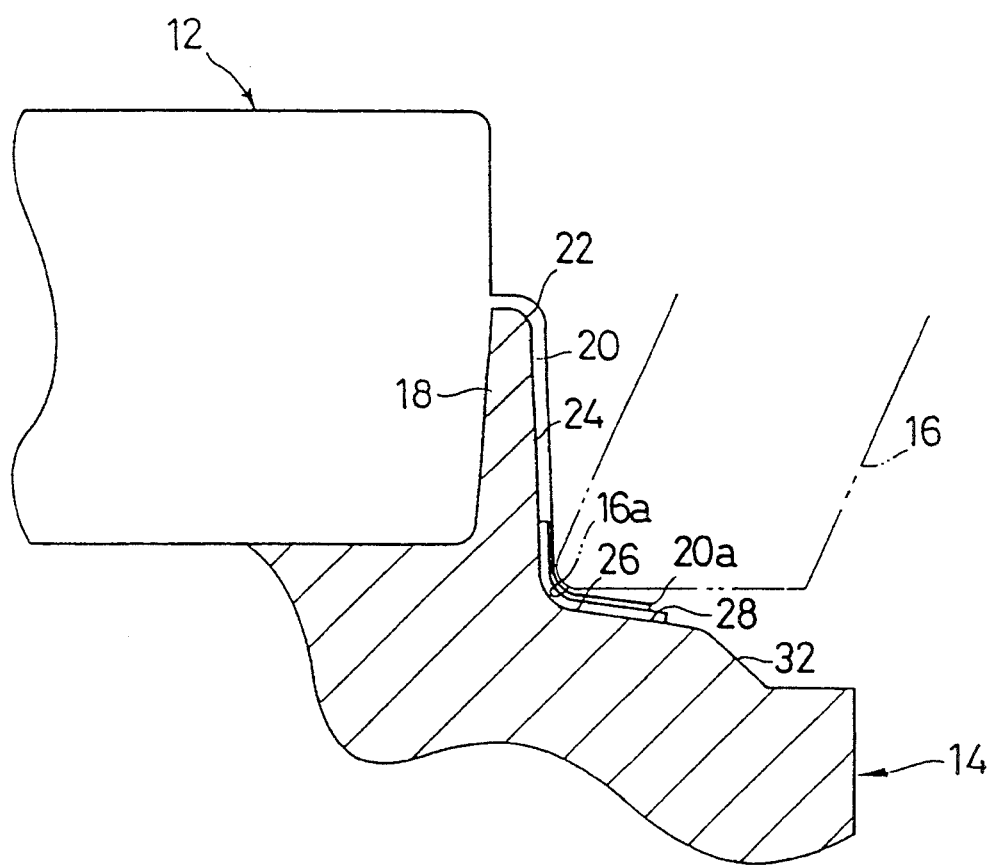
FIG. 6 is another enlarged cross-sectional view showing the final forming step.
Figure 7:
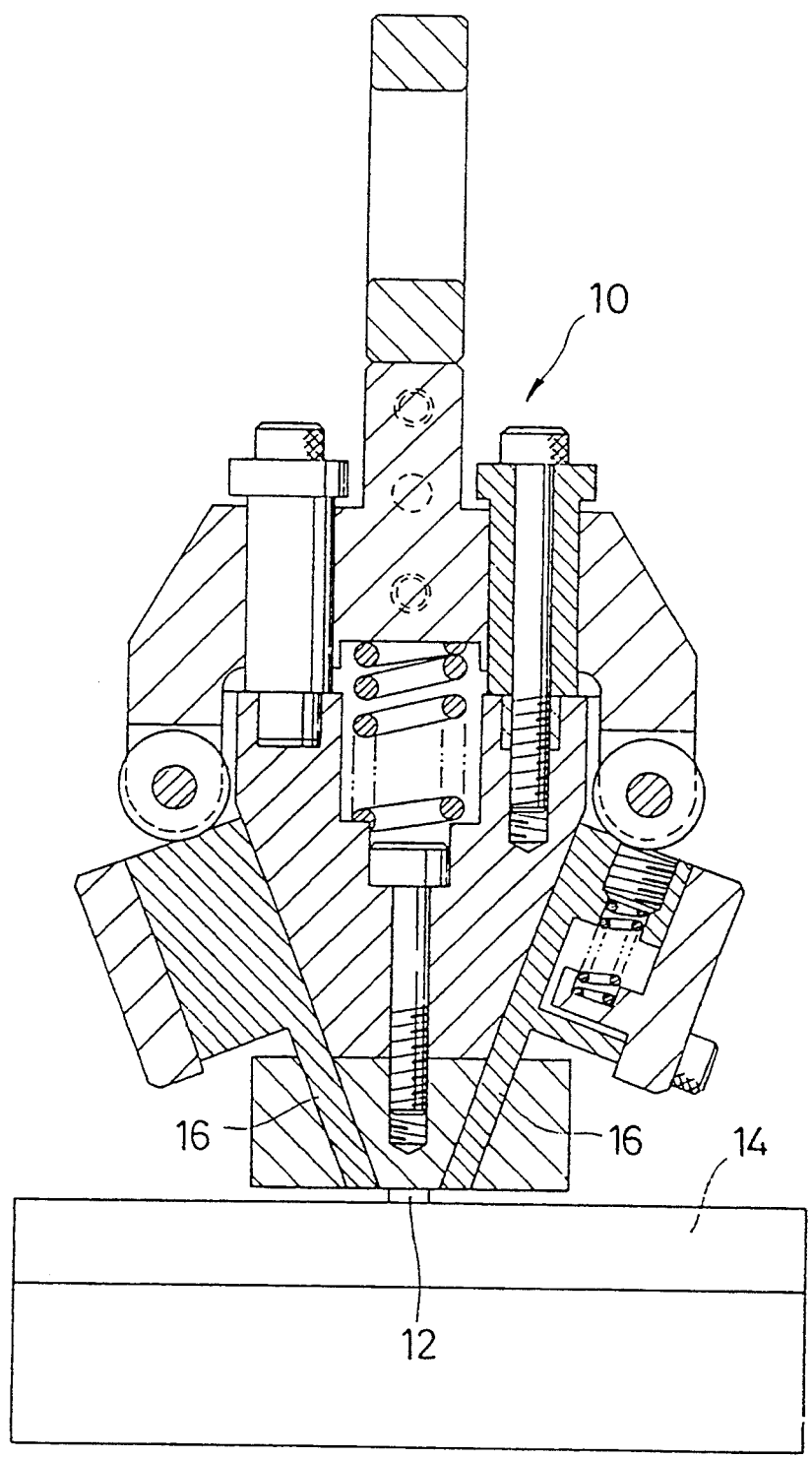
FIG. 7 is a transverse sectional view showing the punch and forming die apparatus made in accordance with the present invention for forming leads of a semiconductor package.
Figure 8:
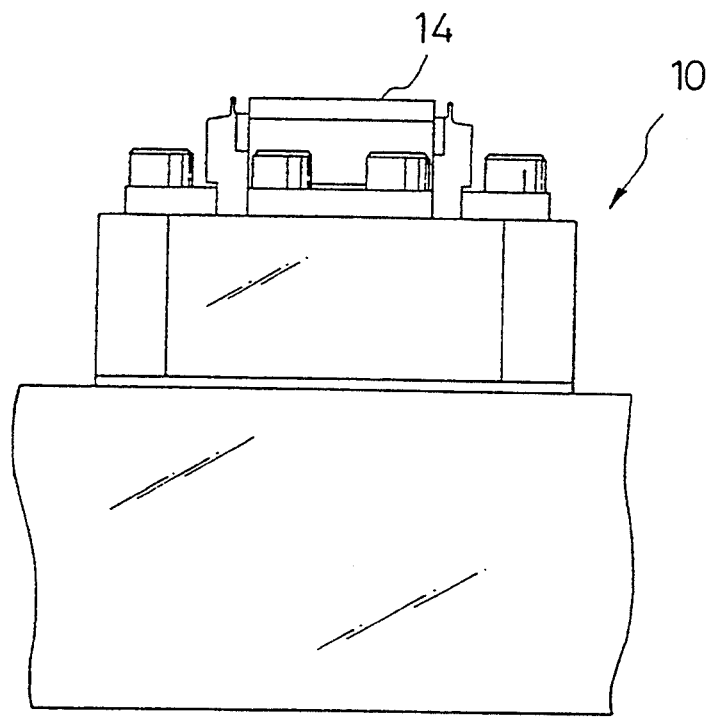
FIG. 8 is a front elevational view of the forming die shown in FIG. 1.

As best shown in FIG. 3, a plurality of elongated spaced straps or ridge portions 34 are formed on the outer surface of wall portions 18 and extend along the first inclined surface 24, rounded juncture 26 and terminate adjacent rounded edge 30. The ridge portions 34 define therebetween a series of grooves 36 which are formed by electric discharge machining to produce surfaces which have a satin finish. Consider now the operation of the apparatus of the present invention in forming the leads of a semiconductor package P of the type shown in FIG. 9. The package P is initially placed in the pocket or seat S-2 formed in the interior of the forming die 14 so that the leads 20 initially project from all sides, and the root or base 20ᵃ of each lead 20 engages the upper edge 18ᵃ of the walls 18. The punch 16 is then moved downwardly in the direction shown by the arrow in FIG. 4 to engage the leads 20 and bend them downwardly toward the contoured outer face of the forming die 14 to the position shown in FIG. 5, where the outer terminal free end 20ᵇ of each lead 20 engage the third inclined surface 32. It is noted that the straight line distance D between the arcuate edge 22 and the third inclined surface 32 is determined by the length of the leads 20 of the package P to be formed. As the punch 16 is moved further downwardly, the nose 16ᵃ of the punch 16 bends the leads to a dogleg shape. The leads 20 are displaced by the punch 16ᵃ to a point where they engage in the grooves 36 and conform to the shape of the surfaces 22, 24, 26 and 28. The final stroke of the punch engages the leads at the juncture 26 of the inclined surfaces 24 and 28. See FIG. 6. The rounded juncture 30 and downwardly inclined surface 32 function to prevent so-called "spring-back" during the forming operation.

In accordance with the present invention, the pressing force of punch 16 can be relatively strong for obtaining the desired lead co-planarity. Further, in conventional bending devices there often occurs lead skew. However, it has been found that the forming die 14 of the present invention eliminates lead skew and the tip to tip separation of the leads may be accurately controlled within prescribed tolerance limits. In the bending process the rear face of the lead 20 defining the mounting surface is satin finished by reason of the groove 36 having a satin finish as discussed above. This improves the adhesiveness of solder used in bonding the semiconductor package P on a substrate or the like.

In accordance with the present invention, the transverse movement of the external lead 20 is prevented by the groove configuration, and thus even an increase of the pressing force of the punch 16 to maintain lead co-planarity does not adversely effect lead skew. Accordingly, it is possible to produce semiconductor packages P having the prescribed accuracy of both lead co-planarity and lead skew. Experiments conducted in forming semiconductor packages P in accordance with the present invention have shown that each external lead bent by use of the forming die 14 of the present invention has a lead co-planarity error of 0.05 mm or less and a lead skew of 0.05 mm or less. Even though particular embodiments have been illustrated and described herein, it is not intended to limit the invention and changes and modifications may be made therein within the scope of the following claims.

What is claimed is:

1. A forming die of a bending device for bending external leads of a semiconductor package, comprising grooves into which said external leads are respectively inserted having lead confronting surfaces of a satin finish.

2. A forming apparatus for bending the leads of a semiconductor package including a body portion, and a plurality of leads extending from the sides of the body portion to a predetermined configuration, comprising: a forming die including a series of walls arranged in a predetermined pattern having a seat for the body portion of the semiconductor package, and a series of stepped outer wall portions; means defining a plurality of elongated spaced rigid portions on the outer surface of the wall portion defining therebetween a series of grooves for receiving the leads of the semiconductor package; and a punch adapted for reciprocating movement relative to the forming die to engage and form the leads so that they conform to the outer wall portions of the die, wherein the leads engage in the grooves formed in the outer wall portion thereof having lead engaging surfaces of a satin finish.

3. Apparatus as claimed in claim 2, wherein the outer wall portions include first, second and third inclined surfaces connected by rounded junctures and are inclined relative to one another to produce leads of a generally Z-shaped configuration.

4. Apparatus as claimed in claim 3, wherein the first inclined surface extends at an angle of about 2° relative to a vertical axis of the die, the second inclined surface extends at an angle of about 83° relative to the axis of the die, and the third surface extends at about an angle of 46° relative to the axis of the die.

5. A method of forming the leads of a semiconductor package including a body portion, and a plurality of leads of Z-shaped configuration extending from the sides of the body portion to a predetermined configuration in a forming die having a seat, a series of stepped outer wall portions and a series of grooves for receiving the leads of the semiconductor package consisting of the steps:

positioning the semiconductor package in the forming die such that the body of the semiconductor package engages the seat of the forming die and the plurality of leads are proximate the stepped outer wall portions and are spaced above the series of grooves; and engaging the leads so that they conform to the outer wall portions of the die wherein the leads engage in the grooves formed in the outer wall portion having lead confronting surfaces of a satin finish.

* * * * *